(12) United States Patent
Scheben et al.

(10) Patent No.: US 9,112,108 B2
(45) Date of Patent: Aug. 18, 2015

(54) ENERGY SOURCE AND METHOD FOR SUPPLYING AN AUTONOMOUS ELECTRICAL LOAD SYSTEM AND THE USE OF SAME

(71) Applicant: Robert Bosch GmbH, Stuttgart (DE)

(72) Inventors: Rolf Scheben, Stuttgart (DE); Mirko Hattass, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 298 days.

(21) Appl. No.: 13/872,948

(22) Filed: Apr. 29, 2013

(65) Prior Publication Data

US 2013/0284227 A1 Oct. 31, 2013

(30) Foreign Application Priority Data

Apr. 30, 2012 (DE) .......................... 10 2012 207 196

(51) Int. Cl.
*H01L 35/30* (2006.01)
*H01L 35/34* (2006.01)

(52) U.S. Cl.
CPC ....................................... *H01L 35/30* (2013.01)

(58) Field of Classification Search
CPC ................................. H01L 35/30; H01L 35/34
USPC .................................................. 136/201, 205
See application file for complete search history.

(56) References Cited

U.S. PATENT DOCUMENTS

| | | | | |
|---|---|---|---|---|
| 3,054,840 A | * | 9/1962 | Alsing | 136/204 |
| 3,127,749 A | * | 4/1964 | Bergvall et al. | 62/3.2 |
| 3,197,342 A | * | 7/1965 | Neild, Jr. | 136/210 |
| 3,400,452 A | * | 9/1968 | Emley | 136/201 |
| 5,228,923 A | * | 7/1993 | Hed | 136/208 |
| 5,584,183 A | * | 12/1996 | Wright et al. | 62/3.7 |
| 6,002,081 A | * | 12/1999 | Sakuragi | 136/203 |
| 7,000,684 B2 | * | 2/2006 | Kenny et al. | 165/80.4 |
| 7,201,217 B2 | * | 4/2007 | Johnson et al. | 165/170 |
| 8,695,355 B2 | * | 4/2014 | Maltezos et al. | 62/3.3 |
| 2002/0007651 A1 | | 1/2002 | Kuiseko et al. | |
| 2002/0075651 A1 | | 6/2002 | Newton et al. | |
| 2004/0104010 A1 | * | 6/2004 | Kenny et al. | 165/80.4 |

FOREIGN PATENT DOCUMENTS

DE 10 2007 017 461 A1 10/2008

\* cited by examiner

*Primary Examiner* — Golam Mowla
(74) *Attorney, Agent, or Firm* — Maginot, Moore & Beck LLP

(57) ABSTRACT

An energy source for supplying an autonomous electrical load system with electrical energy includes a thermogenerator device configured to generate a thermoelectric voltage to be fed to the electrical load system. The thermogenerator device is under the influence of a temperature difference between a warmer first thermal coupling device and a colder second thermal coupling device. The energy source further includes a microfluidic cooling device having a heat-absorption region, a heat-emission region, and a closed microfluidic circulation system configured to circulate a fluid between the heat-absorption region and the heat-emission region. The heat-absorption region has a thermally conductive connection to the second thermal coupling device. The heat-emission region is configured to be coupled to an external heat sink using a thermally conductive connection such that the circulating fluid carries thermal energy away from the second thermal coupling device and transports the thermal energy to the external heat sink.

17 Claims, 4 Drawing Sheets

ENERGY SOURCE AND METHOD FOR SUPPLYING AN AUTONOMOUS ELECTRICAL LOAD SYSTEM AND THE USE OF SAME

This application claims priority under 35 U.S.C. §119 to patent application no. DE 10 2012 207 196.2, filed on Apr. 30, 2012 in Germany, the disclosure of which is incorporated herein by reference in its entirety.

BACKGROUND

The disclosure relates to an energy source and to a method for supplying an autonomous electrical load system and to the use of same.

Autonomous electrical load systems require an energy source which ensures an independent operation of the load system for a relatively long period of time. Suitable energy sources can comprise batteries or rechargeable batteries. Alternatively, suitable energy sources can rely on extracting energy from the environment, for example energy present in the environment in the form of light, vibration, water power, heat or temperature differences.

To make use of temperature differences, thermogenerators are known which, for example, are based on the Seebeck effect. Said thermogenerators use the temperature difference between a relatively warmer (hot) reservoir and a relatively colder (cold) reservoir and generate a thermoelectric voltage, which is used to extract energy.

One example of a known thermogenerator is described in DE 10 2007 017 461 A1 and illustrated in FIG. 1.

In order to achieve a thermoelectric voltage which is as high as possible, a good (highly thermally conductive) coupling of the second substrate (relatively colder during operation) to the heat sink is important. For this purpose, cooling devices in the form of cooling bodies 46 (as in DE 10 2007 017 461 A1) or, for example, liquid-cooled heat exchangers are used for the most part. Said cooling bodies or heat exchangers often have a disadvantageous shape and weight from the point of view of a space-saving installation and, what is more, represent a considerable cost owing to the material expenditure.

In order to cool, for example, integrated circuits, microfluidic cooling devices are known per se. By way of example, US 2002/0075651 A1 discloses an electronic device having an integrated circuit and a microfluidic cooler for cooling the integrated circuit. Said microfluidic cooler comprises a microfluidic fluid circulation system in which the fluid flows against the laterally (planarly) extended integrated circuit, which is to be cooled, in a direction perpendicular to the lateral extension of said integrated circuit and the fluid is diverted radially outwards in the lateral direction by said integrated circuit.

SUMMARY

The disclosure provides an energy source, a method, and a use, all having the features of the disclosure. Advantageous embodiments of the energy source are the subject of the dependent claims.

The disclosure affords the advantage of providing an energy source having a thermogenerator, which energy source is cost-effective to produce and space-saving with regard to installation and provides a thermoelectric voltage which is as high as possible and thus an electric output power which is as high as possible.

According to the disclosure, the energy source comprises, in particular, a microfluidic cooling device having a heat-absorption region, a heat-emission region and a closed microfluidic circulation system, which is designed to circulate a fluid from the heat-absorption region to the heat-emission region and back to the heat-absorption region during operation. In this case, the heat-absorption region of the cooling device has a thermally conductive connection to the second thermal coupling device of the thermogenerator device. In this way, the fluid circulating during operation can carry thermal energy away from the second thermal coupling device and transport said thermal energy away to the heat-emission region. The integration of the microfluidic cooling device and the thermogenerator device makes it possible to continuously transport thermal energy away from the second thermal coupling device of the thermogenerator device. The design of the cooling device as a microfluidic cooling device (instead of, for example, conventional cooling bodies with structures extended longitudinally or, for example, heat exchangers) enables the energy source to have a compact construction and to be produced relatively cost-effectively.

In the energy source of the disclosure, the microfluidic cooling device does not affect the entire thermogenerator device, but rather only the second thermal coupling device, which should be relatively colder than the first thermal coupling device to the greatest possible extent (that is to say, have as large a temperature difference as possible with respect to the first thermal coupling device) during operation. For this reason, in the energy source of the disclosure, the heat-absorption region of the microfluidic cooling device is arranged with a thermally conductive connection to the second thermal coupling device of the thermogenerator device only.

The first thermal coupling device of the thermogenerator device can be coupled using a thermally conductive connection to an external heat reservoir during operation. Furthermore, the heat-emission region can be coupled using a thermally conductive connection to an external heat sink during operation. In this way, the fluid circulating during operation can carry thermal energy away from the second thermal coupling device and transport said thermal energy to the external heat sink. In this way, a large temperature difference can be maintained between the first thermal coupling device, which has a thermally conductive connection to the external heat reservoir, and the second thermal coupling device, and, as a result of this, a relatively high thermoelectric voltage can be generated.

In the thermogenerator device, at least one thermoelectric elementary structure can be formed between the first thermal coupling device and the second thermal coupling device, across which elementary structure a thermoelectric voltage is generated during operation. A thermoelectric elementary structure can comprise a p-type semiconductor and an n-type semiconductor, between which a p-n semiconductor junction is formed, across which a thermoelectric voltage is generated during operation. The configuration of a thermoelectric elementary structure makes it possible to arrange a multiplicity of thermoelectric elementary structures connected in parallel or in series between the first and the second thermal coupling devices, after depending on demand or supply requirements of the external load system to be supplied, in order in this way to generate a total output current increased many times over or a total output voltage increased many times over.

A thermoelectric elementary structure can comprise a first electrical conductor structure, a p-type semiconductor, a second electrical conductor structure, an n-type semiconductor and a third electrical conductor structure, wherein: the first electrical conductor structure and the third electrical conductor structure are arranged with a thermally conductive connection to the first thermal coupling device, the second electrical conductor structure is arranged with a thermally conductive connection to the second thermal coupling device, the p-type semiconductor is arranged in electrical contact between the first electrical conductor structure and the second electrical conductor structure, and the n-type semiconductor is arranged in electrical contact between the second electrical conductor structure and the third electrical conductor structure. A thermoelectric elementary structure formed in this way can be duplicated relatively simply in terms of arrangement between the first and the second thermal coupling devices to form a series circuit or a parallel circuit from a plurality of thermoelectric elementary structures.

The thermogenerator device can comprised a first electrical connection pole and a second electrical connection pole, wherein the first connection pole is arranged with an electrically conductive connection to the p-type semiconductor and the second connection pole is arranged with an electrically conductive connection to the n-type semiconductor. The connection poles make it possible to tap the thermoelectric voltage externally using mechanically and electrically suitably configured connection adapters.

In a first variant configuration, in order to achieve a series circuit (electrical series arrangement) of a plurality of thermoelectric elementary structures and therefore to achieve an output voltage of the energy source which is increased many times over with respect to the thermoelectric voltage, the thermogenerator device can comprise a first electrical connection pole, a second electrical connection pole and a multiplicity of n thermoelectric elementary structures, wherein n is a counting index and an integer greater than 1. In this case, the following can be true for all integer indices i where $1 \leq i \leq (n-1)$: the (i+1)-th thermoelectric elementary structure is arranged with an electrically conductive connection in series with the i-th thermoelectric elementary structure, wherein the first electrical conductor structure of the (i+1)-th thermoelectric elementary structure is arranged with an electrically conductive connection to the third electrical conductor structure of the i-th thermoelectric elementary structure, the first electrical conductor structure of the first thermoelectric elementary structure is electrically conductively connected to the first electrical connection pole, and the third electrical conductor structure of the n-th thermoelectric elementary structure is electrically conductively connected to the second electrical connection pole. An achievable output voltage increases to a corresponding multiple owing to the series circuit of a plurality of thermoelectric elementary structures.

In a second variant configuration, in order to achieve a parallel circuit (electrical parallel arrangement) of a plurality of thermoelectric elementary structures and therefore to achieve an output current of the energy source which is increased many times over with respect to the electric current corresponding to the thermoelectric voltage, the thermogenerator device can comprise a first electrical connection pole, a second electrical connection pole and a multiplicity of n thermoelectric elementary structures, wherein n is a counting index and an integer greater than 1. In this case, the following can be true for all integer indices i where $1 \leq i \leq n$: the i-th thermoelectric elementary structure is arranged in parallel with the others of the n thermoelectric elementary structures, the first electrical conductor structure of the i-th thermoelectric elementary structure is electrically conductively connected to the first electrical connection pole, and the third electrical conductor structure of the i-th thermoelectric elementary structure is electrically conductively connected to the second electrical connection pole. An achievable output current strength increases to a corresponding multiple owing to the parallel circuit of a plurality of thermoelectric elementary structures.

The microfluidic circulation system of the cooling device can comprise, in the heat-absorption region, a first microfluidic cavity, a second microfluidic cavity and at least one first microfluidic passage, which produces a microfluidic flow connection between the first cavity and the second cavity. In this case, during operation, the fluid can evaporate in the heat-absorption region. In particular, the fluid can evaporate in the first cavity, in the at least one first microfluidic passage or in the second cavity. Owing to the spatial separation of the first microfluidic cavity from the second cavity by means of the at least one microfluidic passage (in practice, by means of a multiplicity of microfluidic passages), a dynamic pressure occurs in the microfluidic circulation system upstream of the passages and the circulating fluid remains in the cavities for longer, with the result that more thermal energy is absorbed and thus a more effective evaporation of the fluid takes place.

The microfluidic circulation system of the cooling device can comprise, in the heat-emission region, at least one second microfluidic passage with an inflow region arranged upstream with respect to the second passage and an outflow region arranged downstream with respect to the second passage. In this case, during operation, the fluid can evaporate in the heat-emission region. In particular, the fluid can evaporate in the inflow region, in the at least one second microfluidic passage or in the outflow region. Owing to the second microfluidic passage, a dynamic pressure occurs in the microfluidic circulation system upstream of said passages and the circulating fluid remains in the heat-emission region for longer, with the result that the emission of thermal energy to the surroundings and thus the condensation of the fluid takes place more effectively.

The microfluidic circulation system of the cooling device can further comprise a microfluidic outgoing-flow section and a microfluidic return-flow section, wherein the outgoing-flow section produces a microfluidic flow connection between the second cavity in the heat-absorption region and the inflow region in the heat-emission region, and wherein the return-flow section produces a microfluidic flow connection between the outflow region in the heat-emission region and the first cavity in the heat-absorption region. The heat-absorption region and the heat-emission region are spatially decoupled from one another by means of the outgoing-flow section and the return-flow section and the distance can be set to be sufficiently large that relatively much less of the thermal energy or none at all is conducted back into the heat-absorption region through thermal conduction in housing sections.

The microfluidic cooling device can comprise thermal decoupling means for producing a thermally conductive connection between the heat-emission region and an external heat sink. The thermal decoupling means cause a more effective emission of the thermal energy from the heat-emission region to the surroundings or the surrounding external heat sink.

The microfluidic cooling device can also comprise at least one microelectromechanical (MEM) pump, which is arranged at a suitable position in the microfluidic circulation system. For example, the microelectromechanical pump can be arranged in the return-flow section, for example upstream of the first cavity or downstream of the outflow region of the second passage or in the outflow region of the second passage, or in the outgoing-flow section, for example downstream of the second cavity or upstream of the second passage or in the inflow region of the second passage. Providing an electromechanical pump increases the flow velocity of the circulating fluid and thus the heat transfer capacity from the heat-absorption region to the heat-emission region.

The energy source can be designed to be stackable. In particular, the energy source can be designed modularly in such a way that a stack of p energy sources can be formed, wherein p is counting index and an integer greater than 1. In this case, the following can be true: for all integer indices i where $1 \leq i \leq (p-1)$, the first thermal coupling device of the thermogenerator device of the (i+1)-th energy source has a thermally conductive connection to the heat-absorption region of the microfluidic cooling device of the i-th energy source, the first thermal coupling device of the thermogenerator device of the first energy source can be coupled using a thermally conductive connection to an external heat reservoir, and, during operation, the heat-emission region of the microfluidic cooling device of the i-th energy source can be coupled using a thermally conductive connection to an external heat sink.

The stackability enables a mechanically modular compact arrangement of a plurality of energy sources during operation or during specific applications, in which the electrical load system to be supplied requires a higher electrical input power. Depending on whether a stack of a plurality of energy sources is electrically connected together in series or in parallel, the output voltage or output current of the stack can be increased to a corresponding multiple of the output voltage or the output current of a single energy source.

Preferably, the energy source can be produced as a whole using processes from microsystems engineering, in particular using wafer-processing processes, which can be automated in a manner known to a person skilled in the art. This enables the energy source to be produced cost effectively and effectively, even in relatively large quantities.

In the method according to the disclosure, the simultaneous operation of the microfluidic cooling device and the thermogenerator device, together with the integration of the microfluidic cooling device and the thermogenerator device in the energy source of the disclosure enable the same advantages which are discussed above for the energy source of the disclosure.

An abovedescribed energy source of the disclosure can be used for supplying an autonomous electrical load system with electrical energy or for recovering energy, for example from exhaust-gas heat, in a motor vehicle.

BRIEF DESCRIPTION OF THE DRAWINGS

The disclosure will be described in more detail in the following text by way of example on the basis of embodiments of the disclosure illustrated in the attached figures, in which.

DETAILED DESCRIPTION

Figure 1:
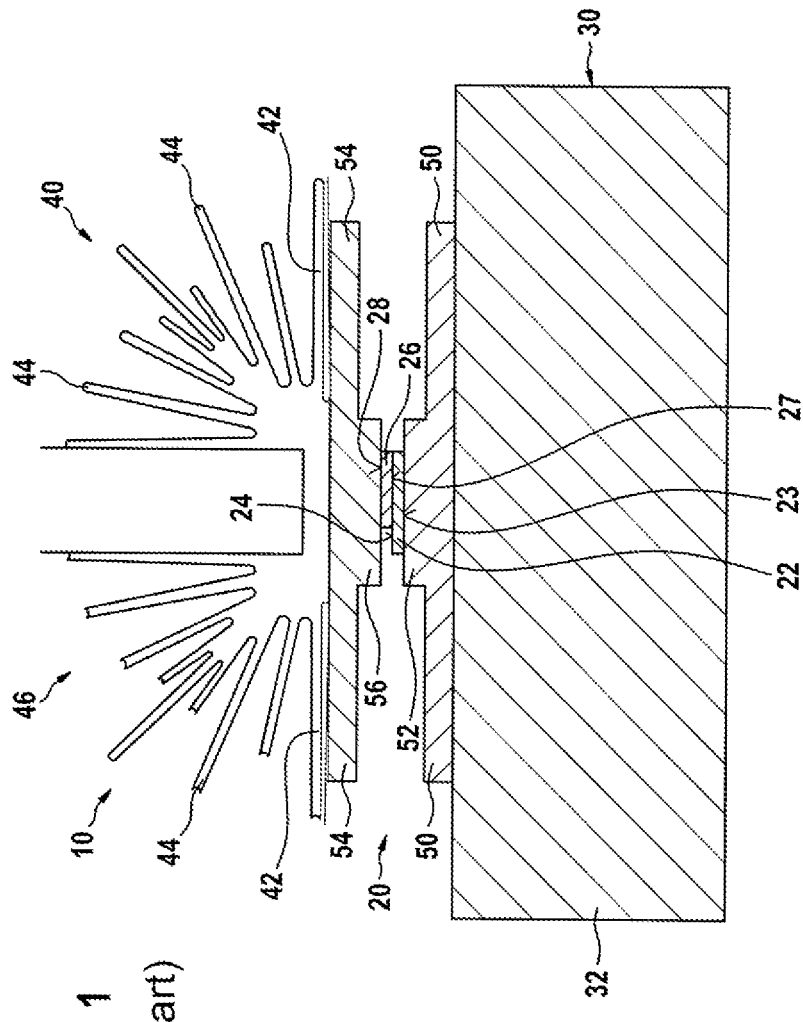
FIG. 1 shows a cross-sectional view of a conventional thermogenerator with a cooling body.

FIG. 1 shows a conventional thermogenerator.

The device, formed as a thermogenerator 20, for supplying 10 energy comprises a first substrate 22 having a first side 23 and a second side 24, a second substrate 26 having a first side 27 and a second side 28, a first heat distributor 50 having a first region 52, which is in contact (thermally conductive connection) with the first side 23 of the first substrate 22, a second heat distributor 54 having a second region 56, which is in contact with the second side 28 of the second substrate 26, and a cooling body 46, serving as heat sink 40, having a substantially planar base structure 42, which is in contact with the outer side of the second heat distributor 54, and a multiplicity of structures 44, which originate from the base structure 42, are extended longitudinally and provide a large area for transmitting thermal energy to the surroundings, for example the surrounding air. The outer side of the first heat distributor 50 is brought into contact (thermally conductive connection) with a heat reservoir 30, for example a container containing a warm medium 32. The first heat distributor 50 conducts heat from the outer side thereof to the first region 52 arranged at the inner side thereof, which lies opposite the outer side, and concentrates thermal energy at the first substrate 22 with the result that a relatively higher temperature is maintained there. The second heat distributor 54 conducts thermal energy from the second substrate 26 to the cooling body 46, which emits a portion of the thermal energy to the surroundings, with the result that a relatively lower temperature than at the first substrate 22 is maintained at the second substrate 26. By means of the temperature difference between the first substrate 22 and the second substrate 26, a thermoelectric voltage occurs between the substrates 22 and 26, which voltage can be used to supply energy to a load system (electrically conductively) connected thereto.

Figure 2:
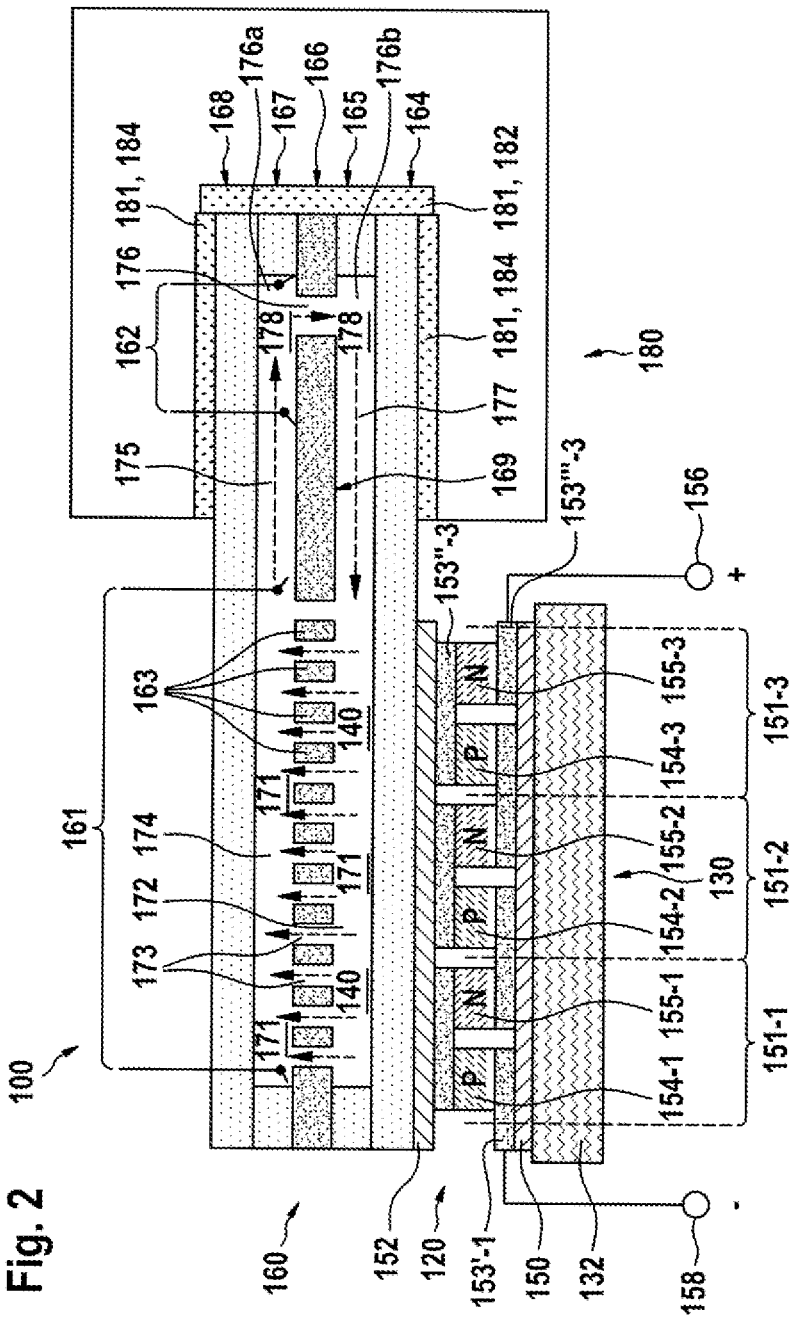
FIG. 2 shows a cross-sectional view of a first embodiment of an energy source according to the disclosure having a thermogenerator device and a microfluidic cooling system, wherein a plurality of thermoelectric elementary cells are arranged in a manner electrically connected in series in the thermogenerator device.

The energy source 100, shown in FIG. 2, comprises a thermogenerator device 120 with a first thermal coupling device 150 for thermally coupling (that is to say, for producing a thermally conductive connection) to an external heat reservoir 130, a multiplicity of thermoelectric elementary cells 151, and a second thermal coupling device 152 for carrying thermal energy away from the thermoelectric elementary cells 151 of the thermogenerator device 120 to a heat-emission region 161 (situated outside of the thermogenerator device 120) of the microfluidic cooling device 160.

Each thermoelectric elementary cell 151 is arranged between the first coupling device 150 and the second coupling device 152 and with a thermally conductive connection to said coupling devices 150 and 152. Each elementary cell 151 comprises a first electrical conductor structure 153', a p-type semiconductor 154, a second electrical conductor structure 153", an n-type semiconductor 155 and a third electrical conductor structure 153'''. In this case, the first and the third electrical conductor structures 153' and 153''' are arranged with a thermally conductive connection to the first thermal coupling device (150), the second electrical conductor structure 153" is arranged with a thermally conductive connection to the second thermal coupling device 152, the p-type semiconductor 154 is arranged in electrical contact between the first electrical conductor structure 153' and the second electrical conductor structure 153", and the n-type semiconductor 155 is arranged in electrical contact between the second electrical conductor structure 153" and the third electrical conductor structure 153'".

The external heat reservoir 130 comprises a relatively warm (hot) heat medium 132, which has a higher temperature than the energy source 100 and in particular the temperature prevailing in the heat-absorption region 161. Under the influence of the temperature difference between the first thermal coupling device 150, which is thermally conductively connected to the hot heat reservoir 130 and the p-type semiconductors 154, and the second thermal coupling device 152, which is thermally conductively connected to the n-type semiconductors 155, a thermoelectric voltage is generated in the thermoelectric elementary cell 151.

In the first embodiment of the energy source 100, shown in FIG. 2, the thermogenerator device 120 comprises a first electrical connection pole 156, a second electrical connection pole (158) and a multiplicity of n thermoelectric elementary structures 151-1, ..., 151-n, wherein n is a counting index and an integer greater than 1 (in FIG. 2: n=3). In this case, the following is true for all integer indices i where $1 \leq i \leq (n-1)$: the (i+1)-th (in FIG. 2: for example the second or third) thermoelectric elementary structure is arranged with an electrically conductive connection in series with the i-th (in FIG. 2: the first or second) thermoelectric elementary structure.

In particular, in the embodiment shown in FIG. 2, the first electrical conductor structure 153' of the (i+1)-th thermoelectric elementary structure is arranged with an electrically conductive connection to the third electrical conductor structure 153'" of the i-th thermoelectric elementary structure 151-i, the first electrical conductor structure 153' of the first thermoelectric elementary structure is electrically conductively connected to the first electrical connection pole 156, and the third electrical conductor structure of the n-th thermoelectric elementary structure is electrically conductively connected to the second electrical connection pole 158. By means of the series circuit of the plurality of (in FIG. 2: three) thermoelectric elementary structures 151, the achieved output voltage is a corresponding multiple of (in FIG. 2: three times) the thermoelectric elementary voltage of one thermoelectric elementary structure.

The energy source 100 further comprises a first electrical connection pole 156 and a second electrical connection pole 158, which serve to decouple the thermoelectric electric voltage generated in the thermoelectric elementary cells 151 and to which an external, for example autonomous, electrical load system (not shown) can be connected in order to be supplied with electrical energy.

In order to carry away the thermal energy flowing toward the second thermal coupling device 154 by thermal conduction and to maintain the temperature difference, the energy source 100 of the disclosure comprises a microfluidic cooling device 160. The microfluidic cooling device 160 comprises a heat-absorption region 161, a heat-emission region 162, and a closed microfluidic circulation system, which comprises a first microfluidic cavity 172, a multiplicity of first microfluidic passages 173, a second microfluidic cavity 174, a microfluidic outgoing-flow section 175, a second microfluidic passage 176 having an inflow region 176a and an outflow region 176b, and a microfluidic return-flow section 177. The microfluidic circulation system 172, 173, 174, 175, 176, 177 is closed to the outside and contains a fluid circulating therein. The first microfluidic cavity 172, the first microfluidic passages 173 and the second microfluidic cavity 174 are located in the heat-absorption region 161 of the cooling device 160.

Figure 4:
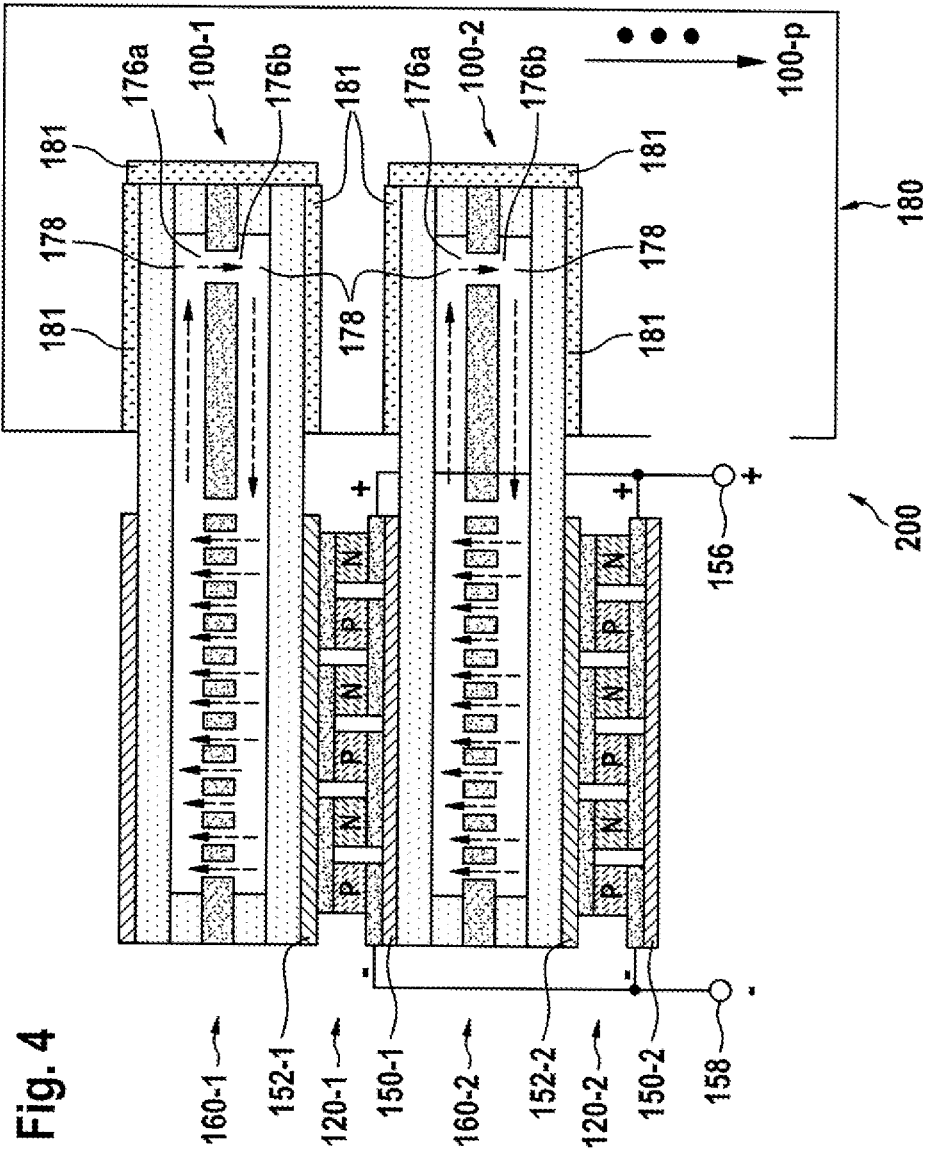
FIG. 4 shows a cross-sectional view of a third embodiment of an energy source according to the disclosure, according to which a plurality of energy sources can be arranged in a stack.

The thermal energy flowing in the heat-absorption region 161 by thermal conduction inter alia from the thermogenerator device 120 effects an increase in temperature in the fluid circulating and flowing through there and causes the fluid to evaporate there. The evaporation of the fluid occurs in the first microfluidic cavity 172, in the first microfluidic passages 173 and/or in the second microfluidic cavity 174. The evaporated fluid flows out of the second cavity 174 through the microfluidic outgoing-flow section 175 (as illustrated in FIG. 4 by a dashed arrow) to the heat-emission region 162, in which at least one second microfluidic passage 176 of the microfluidic circulation system is arranged. In the heat-emission region 162, the circulating fluid emits a portion of the thermal energy transported therewith to the cooler surroundings, which leads to a decrease in temperature of the circulating fluid and condensation of the circulating fluid. The condensation of the fluid occurs in the heat-emission region 162, in the inflow region 176a or directly upstream thereof, in the second microfluidic passage 176, in the outflow region 176b and/or directly downstream thereof. The condensed and cooled-down fluid then flows through the microfluidic return-flow section 177 back into the heat-absorption section 161 and so the flow circuit of the fluid is closed.

The microfluidic cooling device 160 further comprises thermal decoupling means 181, which are formed around the heat-emission region 162 and are designed to conduct thermal energy away from the heat-emission region 162 by thermal conduction. For this purpose, the thermal decoupling means 181 have a thermally conductive connection to an external heat sink 180. The thermal decoupling means 181 comprise a first thermal decoupling device 182, which is arranged at an end face of the cooling device 160, and one or more second decoupling devices 184, which are arranged at lateral side walls of the cooling device 160 with respect to the direction of flow in the outgoing-flow section 175 or return-flow section 177 and have a thermally conductive connection to said side walls.

In the heat-absorption region 161 of the cooling device 160, the multiplicity of first microfluidic passages 173 are separated by a multiplicity of first separating structures 163. The microfluidic outgoing-flow section 175 is spatially separated from the microfluidic return-flow section 177 by means of a second separating structure 169 in the region between the heat-absorption section 161 and the heat-emission section 162. The microfluidic cooling device 160 is designed as a housing which surrounds the closed microfluidic circulation system 172-177. The housing comprises a base structure 164, which, in the heat-emission region 161, is in thermally conductive contact using a thermally conductive connection to an outer surface of the second thermal coupling device 154 of the thermogenerator device 120, first spacer structures 165, intermediate structures 166, second spacer structures 167 and a cover structure 168, as shown in FIG. 2. Together, the first spacer structures 165, the intermediate structures 166 and the second spacer structures 167 substantially form the end housing walls located opposite one another over a longitudinal extent of the microfluidic cooling device 160.

A person skilled in the art recognizes that the elements of the thermogenerator device 120, namely the first thermal coupling device 150, the thermoelectric elementary cells 151, and the elements of the microfluidic cooling device 160, namely the base structure 164, the first and second spacer structures 165 and 167, the intermediate structures 166 and the first and second separating structures 163 and 169, and the elements of the thermal decoupling means 181, namely the first and second thermal decoupling devices 182 and 184, and thus the energy source 100 as a whole is constructed in layers. Thus, the energy source 100 and as a whole can be produced using processes from microsystems engineering, in particular wafer-processing processes, resulting in a cost-effective production of the energy source 100.

Figure 3:
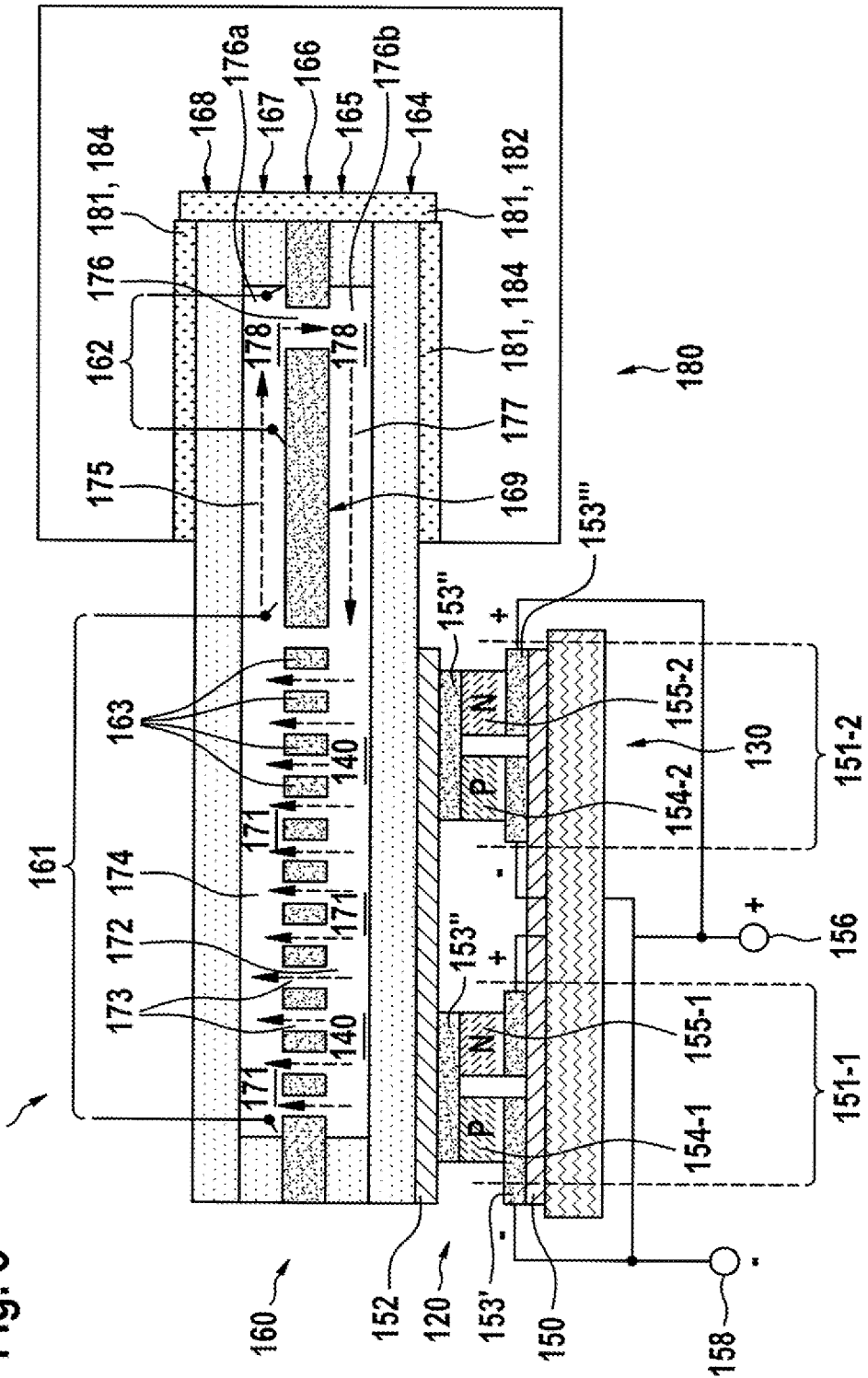
FIG. 3 shows a cross-sectional view of a second embodiment of an energy source according to the disclosure having a thermogenerator device and a microfluidic cooling system, wherein a plurality of thermoelectric elementary cells are arranged in a manner electrically connected in parallel in the thermogenerator device.

In the second embodiment of the energy source 100, shown in FIG. 3, the thermogenerator device 120 in turn comprises a first electrical connection pole 156, a second electrical connection pole (158) and a multiplicity of n thermoelectric elementary structures 151-1, ..., 151-n, where n is a counting index and an integer greater than 1 (in FIG. 3: n=3). In this case, the following is true for all integer indices i where $1 \leq i \leq (n-1)$: the (i+1)-th (in FIG. 3: for example the second or third) thermoelectric elementary structure is arranged with an electrically conductive connection in parallel with the i-th (in FIG. 3: for example the first or second) thermoelectric elementary structure. Furthermore, the first electrical conductor structure 153' of each thermoelectric elementary structure is electrically conductively connected to the first electrical connection pole 156, and the third electrical conductor structure 153''' of each one is electrically conductively connected to the second electrical connection pole 158. By means of the parallel circuit of a plurality of (in FIG. 3: three) thermoelectric elementary structures 151, the achieved output current strength increases to a corresponding multiple of (in FIG. 3: three times) the output current of one single elementary structure.

In the third embodiment, shown in FIG. 4, a plurality of energy sources 100-1, 100-2, 100-3 are designed such that they can be stacked and are arranged in a stack 200. In this embodiment, a stack 200 can be formed from a multiplicity of p energy sources 100-1, ..., 100-p (wherein p is a counting index and an integer greater than 1). The following is true for said stack: for all integer indices i where $1 \leq i \leq (p-1)$, the first thermal coupling device 150-(i+1) (in FIG. 4: for example 150-2) of the thermogenerator device of the (i+1)-th energy source 100-(i+1) (in FIG. 4: for example 100-2) has a thermally conductive connection to the heat-absorption region of the microfluidic cooling device 160-i of the i-th energy source 100-i (in FIG. 4: for example 100-1). The first thermal coupling device 150-p of the thermogenerator device of the p-th energy source (not shown in FIG. 4) can be coupled using a thermally conductive connection to an external heat reservoir (not shown). Furthermore, during operation, the heat-emission region of each microfluidic cooling device 160-1, 160-2, etc. can be coupled using a thermally conductive connection to an external heat sink 180.

The stackability of the energy sources 100-1, 100-2, etc. makes possible a modular and compact arrangement of a plurality of energy sources in specific applications, in which, for example, the electrical load system (not shown) to be supplied requires a higher electrical input power. Depending on whether the energy sources in the stack 200 are electrically connected together in series or in parallel, the output voltage or the output current of the stack is a multiple (depending on the number of energy sources in the stack) of the output voltage or the output current of a single energy source. In this way, energy source modules can be provided with varied rated output voltages or currents.

What is claimed is:

1. An energy source for supplying an autonomous electrical load system with electrical energy, comprising:
   a thermogenerator device configured to generate a thermoelectric voltage to be fed to the electrical load system, the thermogenerator device generating the thermoelectric voltage under the influence of a temperature difference between a first thermal coupling device, which is relatively warmer during operation, and a second thermal coupling device, which is relatively colder during operation; and
   a microfluidic cooling device having a heat-absorption region, a heat-emission region, and a closed microfluidic circulation system configured to circulate a fluid from the heat-absorption region to the heat-emission region and back to the heat-absorption region during operation,
   wherein the heat-absorption region has a thermally conductive connection to the second thermal coupling device.

2. The energy source according to claim 1, wherein:
   the first thermal coupling device is configured to be coupled using a thermally conductive connection to an external heat reservoir during operation, and
   the heat-emission region is configured to be coupled using a thermally conductive connection to an external heat sink during operation such that the circulating fluid carries thermal energy away from the second thermal coupling device and transports the thermal energy to the external heat sink during operation.

3. The energy source according to claim 1, wherein at least one thermoelectric elementary structure is formed in the thermogenerator device between the first thermal coupling device and the second thermal coupling device, the thermoelectric voltage being generated across the elementary structure during operation.

4. The energy source according to claim 3, wherein the thermoelectric elementary structure comprises a p-type semiconductor and an n-type semiconductor between which a p-n semiconductor junction is formed, the thermoelectric voltage being generated across the p-n semiconductor junction during operation.

5. The energy source according to claim 3, wherein:
   the thermoelectric elementary structure comprises a first electrical conductor structure, a p-type semiconductor, a second electrical conductor structure, an n-type semiconductor, and a third electrical conductor structure,
   the first electrical conductor structure and the third electrical conductor structure are arranged with a thermally conductive connection to the first thermal coupling device,
   the second electrical conductor structure is arranged with a thermally conductive connection to the second thermal coupling device,
   the p-type semiconductor is arranged in electrical contact between the first electrical conductor structure and the second electrical conductor structure, and
   the n-type semiconductor is arranged in electrical contact between the second electrical conductor structure and the third electrical conductor structure.

6. The energy source according to claim 4, wherein:
   the thermogenerator device comprises a first electrical connection pole and a second electrical connection pole,
   the first connection pole is arranged with an electrically conductive connection to the p-type semiconductor, and
   the second connection pole is arranged with an electrically conductive connection to the n-type semiconductor.

7. The energy source according to claim 5, wherein:
   the thermogenerator device comprises a first electrical connection pole, a second electrical connection pole, and a multiplicity of n thermoelectric elementary structures where n is a counting index and a natural number greater than 1,
   the following is true for all integer indices i where $1 \leq i \leq (n-1)$: the (i+1)-th thermoelectric elementary structure is arranged with an electrically conductive connection in series with the i-th thermoelectric elementary structure, wherein the first electrical conductor structure of the (i+1)-th thermoelectric elementary structure is arranged with an electrically conductive connection to the third electrical conductor structure of the i-th thermoelectric elementary structure, the first electrical conductor structure of the first thermoelectric elementary structure is electrically conductively connected to the first electrical connection pole, and the third electrical conductor structure of the n-th thermoelectric elementary structure is electrically conductively connected to the second electrical connection pole.

8. The energy source according to claim 5, wherein:
the thermogenerator device comprises a first electrical connection pole, a second electrical connection pole, and a multiplicity of n thermoelectric elementary structures where n is a counting index and a natural number greater than 1, the following is true for all integer indices i where $1 \leq i \leq n$:
the i-th thermoelectric elementary structure is arranged in parallel with the others of the n thermoelectric elementary structures, the first electrical conductor structure of the i-th thermoelectric elementary structure is electrically conductively connected to the first electrical connection pole, and the third electrical conductor structure of the i-th thermoelectric elementary structure is electrically conductively connected to the second electrical connection pole.

9. The energy source according to claim 1, wherein:
the microfluidic circulation system of the cooling device comprises, in the heat-absorption region, a first microfluidic cavity, a second microfluidic cavity, and at least one first microfluidic passage that produces a microfluidic flow connection between the first cavity and the second cavity, and the fluid evaporates in the heat-absorption region during operation.

10. The energy source according to claim 1, wherein:
the microfluidic circulation system of the cooling device comprises, in the heat-emission region, at least one second microfluidic passage with an inflow region arranged upstream with respect to the second passage and an outflow region arranged downstream with respect to the second passage, and the fluid condenses in the heat-emission region during operation.

11. The energy source according to claim 9, wherein:
the microfluidic circulation system of the cooling device comprises, in the heat-emission region, at least one second microfluidic passage with an inflow region arranged upstream with respect to the second passage and an outflow region arranged downstream with respect to the second passage, and the fluid condenses in the heat-emission region during operation, the microfluidic circulation system further comprising:
a microfluidic outgoing-flow section configured to produce a microfluidic flow connection between the second cavity in the heat-absorption region and the inflow region in the heat-emission region, and a microfluidic return-flow section configured to produce a microfluidic flow connection between the outflow region in the heat-emission region and the first cavity in the heat-absorption region.

12. The energy source according to claim 1, wherein the microfluidic cooling device comprises a thermal decoupling mechanism configured to produce a thermally conductive connection between the heat-emission region and an external heat sink.

13. The energy source according to claim 1, wherein:
a stack of p energy sources are configured to be formed where p is a counting index and an integer greater than 1,
the following is true for all integer indices i where $1 \leq i \leq (p-1)$: the first thermal coupling device of the thermogenerator device of the (i+1)-th energy source has a thermally conductive connection to the heat-absorption region of the microfluidic cooling device of the i-th energy source, the first thermal coupling device of the thermogenerator device of the first energy source is configured to be coupled using a thermally conductive connection to an external heat reservoir, and the heat-emission region of the microfluidic cooling device of the i-th energy source is configured to be coupled using a thermally conductive connection to an external heat sink during operation.

14. A method for supplying an autonomous electrical load system with electrical energy from an energy source, the energy source including a thermogenerator device configured to generate a thermoelectric voltage to be fed to the electrical load system, the thermogenerator device generating the thermoelectric voltage under the influence of a temperature difference between a first thermal coupling device, which is relatively warmer during operation, and a second thermal coupling device, which is relatively colder during operation, the energy source further including a microfluidic cooling device having a heat-absorption region, a heat-emission region, and a closed microfluidic circulation system configured to circulate a fluid from the heat-absorption region to the heat-emission region and back to the heat-absorption region during operation, the heat-absorption region having a thermally conductive connection to the second thermal coupling device, the method comprising:

producing a thermally conductive connection between the first thermal coupling device of the thermogenerator device of the energy source and an external heat reservoir;

producing a thermally conductive connection between the heat-emission region of the microfluidic cooling device of the energy source and an external heat sink;

connecting the electrical load system to the thermogenerator device;

operating the thermogenerator device such that, under the influence of the temperature difference between the first thermal coupling device and the second thermal coupling device, a thermoelectric voltage is generated and fed to the electrical load system; and at the same time, operating the microfluidic cooling device such that the fluid circulating in the closed microfluidic circulation system during operation absorbs thermal energy from the internal heat sink of the energy source in the heat-absorption region, transports the thermal energy to the heat-emission region, and emits the thermal energy via the thermally conductive connection to the external heat sink.

15. The energy source according to claim 1, wherein the energy source is used to one or more of supply electrical energy to the autonomous electrical load system and recover energy from exhaust-gas heat in a motor vehicle.

16. The energy source according to claim 9, wherein the fluid evaporates in the first cavity, the at least one first microfluidic passage, or the second cavity.

17. The energy source according to claim 10, wherein the fluid condenses in the inflow region, the at least one second microfluidic passage, or the outflow region.

* * * * *